(12) United States Patent
Lalovic et al.

(10) Patent No.: US 7,081,956 B1
(45) Date of Patent: Jul. 25, 2006

(54) METHOD AND DEVICE FOR DETERMINING REFLECTION LENS PUPIL TRANSMISSION DISTRIBUTION AND ILLUMINATION INTENSITY DISTRIBUTION IN REFLECTIVE IMAGING SYSTEM

(75) Inventors: Ivan Lalovic, Mountain View, CA (US); Bruno M. LaFontaine, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 320 days.

(21) Appl. No.: 10/727,393

(22) Filed: Dec. 4, 2003

(51) Int. Cl.
*G01B 11/00* (2006.01)

(52) U.S. Cl. ..................................... 356/400

(58) Field of Classification Search ............... 356/400, 356/401; 355/44, 45
See application file for complete search history.

(56) References Cited

U.S. PATENT DOCUMENTS

| | | | |
|---|---|---|---|
| 4,000,949 A | 1/1977 | Watkins ...................... 356/165 |
| 4,399,356 A * | 8/1983 | Feinleib et al. .......... 250/201.9 |
| 4,444,456 A * | 4/1984 | Jain et al. ...................... 359/16 |
| 5,153,989 A | 10/1992 | Suzuki et al. .................. 378/34 |
| 5,300,967 A | 4/1994 | Kamon ...................... 353/97 |
| 5,321,681 A * | 6/1994 | Ramsay et al. ............... 369/69 |
| 5,396,311 A | 3/1995 | Fukushima et al. ........... 355/71 |
| 5,420,417 A * | 5/1995 | Shiraishi ...................... 250/205 |
| 5,461,456 A | 10/1995 | Michaloski .................. 355/67 |
| 5,973,771 A | 10/1999 | Kibbs et al. ................. 356/121 |
| 6,621,571 B1 * | 9/2003 | Maeda et al. ............ 356/237.5 |
| 6,800,859 B1 * | 10/2004 | Shishido et al. ............ 250/372 |
| 6,927,887 B1 * | 8/2005 | Naulleau ...................... 359/15 |
| 6,977,717 B1 * | 12/2005 | Lalovic et al. ................. 355/67 |
| 2003/0053066 A1 * | 3/2003 | Redner ....................... 356/448 |
| 2003/0091913 A1 | 5/2003 | Shiode ......................... 430/22 |
| 2003/0099034 A1 | 5/2003 | Mann et al. ................. 359/359 |
| 2003/0210391 A1 * | 11/2003 | Uto et al. ................. 356/237.1 |
| 2004/0136075 A1 * | 7/2004 | Augustyn et al. ........... 359/572 |

* cited by examiner

*Primary Examiner*—Gregory J. Toatley, Jr.
*Assistant Examiner*—Isiaka O. Akanbi
(74) *Attorney, Agent, or Firm*—Renner, Otto, Boisselle & Sklar, LLP (57) ABSTRACT

A method and device for determining reflection lens pupil transmission distribution in a photolithographic reflective imaging system, the device including an illumination source; a reticle supporting a reflective mask layer having a plurality of light-reflecting areas and non-reflecting areas thereon; a diffuser mounted with respect to the reflective mask layer; a lens system including one or more reflective elements; and an image plane, in which a pupil image corresponding to one or more of the plurality of light-reflecting areas in the reflective mask layer is formed at or near the image plane when light from the illumination source passes through the diffuser to the reflective mask layer, reflects from the light-reflecting areas and passes through the lens system, the pupil image having a reflection lens pupil transmission distribution. The method includes obtaining a pupil image with and without the diffuser in place in the device.

20 Claims, 3 Drawing Sheets

METHOD AND DEVICE FOR DETERMINING REFLECTION LENS PUPIL TRANSMISSION DISTRIBUTION AND ILLUMINATION INTENSITY DISTRIBUTION IN REFLECTIVE IMAGING SYSTEM

BACKGROUND OF THE INVENTION

1. Technical Field

The present invention relates to photolithographic lens systems and, more specifically, to a method and apparatus for determining reflection lens transmission distribution while separating contributions of the illumination source aperture uniformity from the reflection lens pupil transmission distribution in a lens system having reflective elements, such as for use with extreme ultraviolet (EUV) lithography.

2. Background

Optical photolithography has been widely used in the semiconductor industry in connection with the formation of a wide range of structures in integrated circuit (IC) chips. As device critical dimensions continue to be reduced, lithography has been forced to move from the visible into the UV, deep UV and extreme UV wavelengths. In doing so, the radiation manipulation means has shifted from transmission-based systems to reflection-based systems. Complex systems of reflective optics have become increasingly common for the purpose of improving resolution or depth of focus. The ability to measure and verify the correct distribution of illumination in the pupil plane is as important in reflection-based systems as it is in transmission-based systems.

Uniformity of the illumination at the wafer surface is needed so that the same exposure of photoresist or other radiation-sensitive films is consistently achieved across the entire exposure field. The degree of partial incoherency of the illumination, or more generally the distribution of pupil illumination, must also be constant across the entire exposure field. As tolerances of the printed lithographic patterns become increasingly tight, the requirement that the pupil illumination distribution not vary across the exposure field becomes increasingly important.

Various illumination systems for lithographic lenses have been developed, including those that create complex patterns of pupil illumination to enhance lithographic resolution and/or depth of focus. Illumination patterns, such as dipole, quadrupole, and annular shapes, have been developed to improve the resolution and depth of focus of the image formation. Some of these illumination patterns are particularly suited to enhancing the lithographic performance of specific mask patterns that are exposed on the stepper. When conventional partially coherent illumination is used, the center of the pupil is illuminated uniformly out to a prescribed fraction of the pupil size. In the case of both conventional partially coherent illumination and the more complex off-axis illumination patterns, the consistency of the illumination pattern at every position in the exposure field is critical.

There is a pervasive trend in the art of IC fabrication to increase the density with which various structures are arranged. As a result, there is a corresponding need to increase the resolution capability of lithography systems. One promising alternative to conventional optical lithography is a next-generation lithography technique known as extreme ultraviolet (EUV) lithography where wavelengths in the range of about 11 nm to about 14 nm are used to expose the photoresist layer. For example, using a numerical aperture of about 0.25, a wavelength of about 13.4 nm and a $k_1$ value of about 0.6, it has been proposed that a resolution of about 32 nm can be achieved.

The quality and uniformity of the illumination at the wafer plane can be analyzed and characterized by a variety of techniques, including wafer-plane power meters, analysis of photoresist or other light-sensitive films, etc. In the past, the pupil illumination has been measured by using either a single, relatively large (one to a few millimeters) aperture in the plane of the photomask, or a plurality of pinholes in an array. In both cases, the aperture functions as a pinhole camera and projects a geometrical image of the pupil illumination pattern. However, this method provides only an overall result, and does not separate sources of any observed non-uniformity.

As dimensions of IC components are continually reduced, and as the wavelength of radiation used in photolithography is reduced, effects of non-uniformity in illumination at the wafer plane become increasingly important. In order to remedy such non-uniformity, the source thereof needs to be identified. Therefore, a need exists for a system that can efficiently obtain quantitative measurements of the illumination pattern at the wafer plane of the photolithographic lens system, while separating contributions to non-uniformity originating from various portions of the photolithographic apparatus.

SUMMARY OF THE INVENTION

As one aspect of determining the sources of non-uniformity in illumination at the wafer plane, in one embodiment, the present invention relates to a method of separating contributions to non-uniformity originating in the illumination source from contributions to non-uniformity originating in the lens system. In the past it has not been possible to separate these sources of non-uniformity.

In one embodiment, the present invention relates to a device for determining reflection lens pupil transmission distribution in a photolithographic reflective imaging system, the device including an illumination source; a reticle supporting a reflective mask layer having a plurality of light-reflecting areas and non-reflective areas thereon; a diffuser mounted with respect to the reflective mask layer; a lens system comprising one or more reflective elements; and an image plane, in which a pupil image corresponding to one or more the plurality of light-reflecting areas in the reflective mask layer is formed at or near the image plane when light from the illumination source passes to the diffuser, passes to the reflective mask layer, reflects from the light-reflecting areas and passes through the lens system, the pupil image having a reflection lens pupil transmission distribution.

In another embodiment, the present invention relates to a method for determining reflection lens pupil transmission distribution and illumination source aperture uniformity in a photolithographic imaging system, including providing a photolithographic imaging system including an illumination source, a reticle supporting a reflective mask layer having a plurality of light-reflecting areas and non-reflective areas thereon, and a lens system comprising one or more reflective elements; measuring first pupil intensity distribution of one or more first pupil image at an image plane, the one or more first pupil image formed by light reflected by corresponding ones of the plurality of light-reflecting areas while passing light from the illumination source to the reflective mask layer and through the lens system; mounting a diffuser with respect to the reflective mask layer; measuring second pupil intensity distribution of one or more second pupil image at the image plane, the one or more second pupil image formed by light reflected by corresponding ones of the plurality of light-reflecting areas while passing light from the illumination source, to the diffuser, to the reflective mask layer and through the lens system; and comparing the first and the second pupil intensity distributions to determine intensity distribution of radiation emanating from the illumination source and the lens system. In another embodiment, the present invention relates to a device for determining both illumination source aperture uniformity and reflection lens pupil transmission distribution in a photolithographic reflective imaging system, the device including an illumination source; a reticle supporting a reflective mask layer having a plurality of light-reflecting areas and non-reflecting areas thereon; a diffuser removably mounted with respect to the reflective mask layer; a lens system comprising one or more reflective elements; and an image plane, in which a first pupil image corresponding to one or more of the plurality of light-reflective areas in the reflective mask layer is formed at or near the image plane when the diffuser is removed and light from the illumination source reflects from the light-reflecting areas and passes through the lens system, the first pupil image having a first pupil intensity distribution $P_{(x,y)\ no\ diffuser}$; and a second pupil image corresponding to one or more of the plurality of light-reflective areas in the reflective mask layer is formed at or near the image plane when the diffuser is mounted and light from the illumination source passes to the diffuser, reflects from the light-reflecting areas and passes through the lens system, the second pupil image having a second pupil intensity distribution $P_{(x,y)\ diffuser}$, and the following relationships are defined:

$$P_{(x,y)diffuser} \cong P_{(x,y)reflective\ lens} \quad (1)$$

and $$P_{(x,y)diffuser}/P_{(x,y)no\ diffuser} \cong P_{(x,y)illumination\ source} \quad (2).$$

In one embodiment, the diffuser randomizes or homogenizes one or more of the intensity, spatial intensity distribution, phase, coherence and propagation direction of the light passing therethrough. In one embodiment, the diffuser eliminates or substantially alters contributions of the illumination source aperture uniformity from the projection lens pupil transmission distribution. As a result of using the diffuser, it is possible to better identify sources of non-uniformity in images formed at the wafer in a photolithographic lens system.

Thus, the present invention provides a system that can efficiently obtain quantitative measurements of the illumination pattern at the wafer plane of the photolithographic lens system, while separating contributions to non-uniformity originating in the illumination source from contributions to non-uniformity originating in the reflection lens system.

It should be appreciated that for simplicity and clarity of illustration, elements shown in the Figures have not necessarily been drawn to scale. For example, the dimensions of some of the elements may be exaggerated relative to each other for clarity. Further, where considered appropriate, reference numerals have been repeated among the Figures to indicate corresponding elements.

It should be appreciated that the process steps and structures described below do not form a complete process flow for operating a photolithographic imaging system or for constructing a complete photolithographic imaging device. The present invention can be practiced in conjunction with evaluation techniques, processing methods and fabrication techniques currently used in the art, and only so much of the commonly practiced process steps and known devices and systems are included as are necessary for an understanding of the present invention.

DETAILED DESCRIPTION OF THE INVENTION

Figure 1:
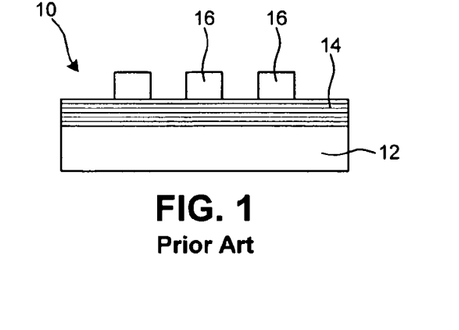
FIGS. 1 and 2 are schematic cross-sectional diagrams depicting two types of reflective mask layers which may be used in conventional photolithographic reflective lens systems.
Figure 2:
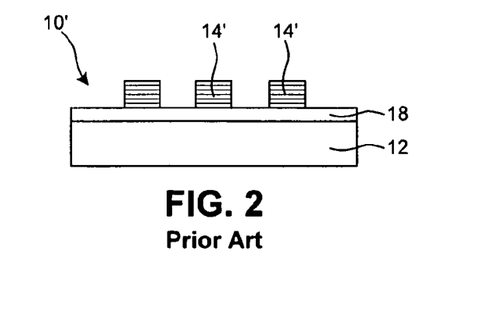

The present invention relates to device elements and a method of using those elements that may be used in conjunction with virtually any conventional or non-conventional photo lithographic lens system which uses a reflective mask layer. Two types of a conventional reflective mask layer are shown in FIGS. 1 and 2. FIG. 1, illustrates a conventional EUV lithography mask 10. The mask 10 includes a glass substrate 12. The glass substrate 12 may be mounted on a suitable reticle (not shown). A multilayer reflector film stack 14 is deposited on an upper surface of the substrate 12. The multilayer stack 14 can be made from alternating layers of high-Z and low-Z materials, such as molybdenum and silicon layers (Mo/Si), molybdenum carbon and silicon layers ($Mo_2C$/Si), molybdenum and beryllium layers (Mo/Be), or molybdenum ruthenium and beryllium layers (MoRu/Be). Together, the substrate 12 and multilayer stack 14 can form a mask blank.

To function as, e.g., an EUV lithography mask, EUV absorbing material can be deposited and patterned on the multilayer stack 14 to form a plurality of absorbers 16. The EUV absorbing material 16 is a non-reflecting material, since it absorbs the EUV light. Although the absorbers 16 are illustrated as individual structures, the absorbers 16 can form an interconnected pattern. A buffer layer (not shown) can be formed between the multilayer stack 14 and the absorbing material 16 to facilitate etching of the absorbing material with minimal damage to the multilayer stack 14. Absorbers have been made from chromium (Cr), titanium nitride (TiN) and tantalum nitride (TaN).

Alternatively, as shown in FIG. 2, a functional EUV lithography mask 10' can be formed by patterning the multilayer stack 14 of the mask blank to form a plurality of individual or interconnected multilayer reflectors 14'. In this alternative arrangement, a conductive or other non-reflecting layer 18 can be present between the etched multilayer reflectors 14' and the substrate 12. In the mask 10', the non-reflecting layer 18 may be either EUV transmissive or EUV absorbing, as long as it does not effectively reflect incoming EUV radiation or, in other embodiments, other radiation. Either of these types of reflective mask layer can be used with the present invention. The methods of the present invention are applicable to devices having both of these types of reflective mask layer.

FIGS. 3–7 are schematic diagrams depicting the photolithographic reflective lens systems of several embodiments of a device (100, 200, 300, 400 and 500, respectively) for determining reflection lens pupil transmission distribution in accordance with the present invention. The devices 100, 200, 300, 400 and 500 include parts of a photolithographic imaging system, but only so much of such a system as is needed to illustrate the present invention are shown in FIGS. 3–7.

In each of FIGS. 3–6 and 7, in the devices 100, 200, 300, 400 and 500, respectively, there is an illumination source 20 which directs its light or other electromagnetic radiation 22 of appropriate wavelength as generally depicted by the arrows. The general arrangement of the devices 100, 200, 300, 400 and 500, respectively, is relatively well known in the art and will not be described in great detail, except as needed to describe the present invention. The devices 100, 200, 300 and 400, shown in FIGS. 3–6, include a similar diffuser, and are described first. The device 500, shown in FIG. 7, includes a different type of diffuser, and so will be described separately. The basic parts and functioning of the device 500 is similar to that of the devices 100, 200, 300 and 400, so most of the description of the devices 100, 200, 300 and 400 is applicable to the device 500.

As used herein, the term "light" generally refers to light or other electromagnetic radiation of appropriate wavelength, and specifically includes EUV radiation. For example, the term light as used herein may refer to radiation having wavelengths such as 248 nm, 193 nm, 157 nm, down to and including EUV radiation having a wavelength in the range of about 11 nm to about 14 nm, and specifically about 13.4 nm to 13.5 nm, or other wavelengths used with transmission (refractive) optics, reflective (cataoptric) optics or combinations of refractive and reflective (catadioptric) optics. Thus, unless otherwise specified, the term "light" may refer to radiation of any wavelength in the electromagnetic spectrum appropriate for use in lithography.

With reference to FIGS. 3–6, in one embodiment, the devices 100, 200, 300, 400 include a EUV light source as the illumination source 20. In this embodiment, the EUV energy illumination source 20 can include, for example, a high power laser that generates highly ionized atoms from matter onto which the laser is directed, thereby generating EUV energy as the light 22, or by using a synchrotron. In an EUV embodiment, the EUV energy or light 22 can have a wavelength of about 11 nm to about 14 nm, and in one embodiment, the wavelength can be about 13.4 nm.

In each of the embodiments shown in FIGS. 3–6, the light 22 is directed to and passes through a diffuser 24. The diffuser 24 may also be referred to as a randomizer. In one embodiment, the diffuser 24 is a random phase plate. The random phase plate randomizes the phase of the incoming radiation, thus effectively diffusing it and "erasing" or removing any non-uniformity in the light originating from the illumination source 20 and arriving at the diffuser 24. Such non-uniformity also may be referred to as a signature of the illumination source 20. By providing the diffuser 24, any contributions from the illumination source 20 to any observed non-uniformity of the pupil images subsequently produced can be erased or eliminated, or in one embodiment, substantially reduced.

In one embodiment, light passing through the diffuser sustains at least some degree of homogenization or randomization of one or more of intensity, spatial intensity distribution, phase, coherence and propagation direction of the light. Thus, in one embodiment, a diffuser is any device which causes at least some degree of homogenization and/or randomization of one or more of these properties of light from an illumination source. Other devices which may act to diffuse light from an illumination source such as that described herein include, for example, a pinhole or aperture which is oscillated perpendicular to the direction of propagation of the light. Such pinhole or aperture could be in the form of a wire mesh, and in one embodiment, a random wire mesh, which is oscillated perpendicular to the direction of propagation of the light. A reflective/scattering plate, which also can be oscillated, may also function to homogenize and/or randomize light passing through the device. The terms diffusion, homogenization, randomization and blurring are all intended to describe or identify the effect of the diffuser upon light passing therethrough. These terms may be used interchangeably. The purpose of the diffuser is to remove information, in any form (such as those exemplified above), from the light emanating from the illumination source, so that the light is uniform.

In one embodiment, the diffuser 24 can be oscillated during operation of the device. The oscillation is depicted in FIGS. 3–7 by arrows 26. In one embodiment, the oscillation in the directions indicated by the arrows 26 is the mechanism by which the light 22 is diffused or randomized. As will be described in more detail below, the diffuser 24 is removable and is removed from the device during a portion of a method of using the devices 100, 200, 300 or 400 such as those described here.

As shown in FIGS. 3–7, the light 22 which has encountered the diffuser 24 leaves the diffuser as diffused light 28. In one embodiment, the diffused light 28 is randomized. In one embodiment, the diffused light 28 is substantially free of non-uniformity from the illumination source 24. In another embodiment, the diffused light 28 is free of any non-uniformity or pattern imparted by the illumination source 20.

The diffused light 28, in the embodiments shown in FIGS. 3–6, next strikes a mask or reticle 30 bearing a pattern of light-reflecting areas and non-reflecting areas. The mask or reticle 30 is described in greater detail below and is similar to the conventional masks 10, 10' shown in FIGS. 1 and 2 and described above. The mask or reticle 30 can be retained by an electrostatic mask platen assembly 32 that includes an electrostatic chuck. A portion of the diffused light 28 that strikes the mask or reticle is reflected from the reflective areas as patterned light 34. Thus the mask 30 selectively absorbs and reflects the light diffused light 28, and the patterned light 34 carries information based on the pattern of light-reflecting areas and non-reflecting areas on the mask 30.

An imaging subsystem, or lens system 36, such as a stepper assembly or a scanner assembly, which includes, e.g., lenses and reflective elements, subsequently directs the patterned light 34 as an exposure pattern 38 towards a wafer 40. The wafer 40 may be mounted, for example, on a wafer stage platen assembly 42, which may include, for example, an electrostatic chuck.

In carrying out the method of the present invention, and using the device 100, 200, 300, 400 with the diffuser 24 in place, an actual production wafer 40 may not be used. The wafer 40 is mentioned here as part of the device in its "normal" operation for completeness. In one embodiment, the wafer 40 is replaced with a suitable light-detection apparatus for precisely measuring the intensity distribution and/or uniformity of a pupil image pattern formed by the exposure pattern 38, as described below.

In one embodiment, the assemblies 32 and 42 can be housed in separate chambers, as generally shown in FIGS. 3–6. The assembly 32 and the mask 30 can be housed in a mask chamber that can be maintained at high or ultra-high vacuum (e.g., between about $10^{-5}$ torr and about $10^{-11}$ torr). The assembly 42 and wafer 40 can be housed in a wafer chamber that is maintained at high or ultra-high vacuum (e.g., between about $10^{-5}$ torr and about $10^{-11}$ torr). The chamber can include an aperture (not shown) through which the exposure pattern 38 passes. The remaining elements (e.g., the lens system 36) can be housed in one or more chambers that are kept, for example, in vacuum to minimize attenuation of the EUV radiation.

Although not specifically shown, various optical elements may be included in the lens system 36, in particular reflective elements and/or refractive elements. Since there may be any of a wide variety of arrangements of such optical elements which could be used in this portion of the devices, specific, separate embodiments are not shown. As well as reflective and/or refractive elements, these optical elements may include elements such as an aperture stop, a condenser lens, one or more off-axis openings such as a dipole, quadrupole or annular pattern, or any other suitable pattern, which directs and shapes the light onto the elements described in the following, and other optical elements known in the art.

In each of the devices 100, 200, 300, 400 and 500 shown in FIGS. 3–7, there is an object plane 44 associated with the mask 30 and an image plane 46 associated with the mask 40 (or the location at which the mask 40 would normally be located). The object plane 44 is defined as the focal plane for the incoming diffused light 28. The image plane 46 is defined as the focal plane for the exposure pattern 38. The image plane 46 thus corresponds to the location at which the exposure pattern 38 would be focused on the surface of the wafer 40 if present.

A mask pattern 48 is defined on the mask or reticle 30, at or near the object plane 44. A pattern of pupil images 50 is formed at a pupil plane 52. The pupil images 50 correspond to the light-reflecting areas 48 in the mask 30. In various embodiments, as described in more detail below, the pupil plane 52 is at or near the image plane 46, and thus the pupil images are formed at or near the image plane 46. The pupil images 50 formed at the pupil plane 52 are slightly defocused. In carrying out the method, and using the device of the present invention, in order to measure the intensity and distribution of the light in the exposure pattern 38 as it forms the pupil image pattern 50, it has been found useful slightly defocus the light in the exposure pattern 38 in order to make measurement of the intensity and distribution of the light easier. If the light is exactly focused, measurement of the intensity and distribution is more difficult, because the images are smaller and more concentrated. Thus, the pupil images 50 corresponding to one or more of the plurality of light-reflecting areas 14 or 14' in the pattern 48 are used to determine a reflection lens pupil transmission distribution.

Referring still to FIGS. 3–7, a more detailed description of the operation of the devices 100–500 is provided, with differences noted. In each of FIGS. 3-7, the mask 30 is shown similar to the conventional EUV mask shown in FIG. 2. As noted above, the present invention is not limited to EUV systems, but is generally applicable to any reflective mask and wafer exposure system. Thus, the pattern 48 in each mask 30 is formed by individual reflective elements similar to the reflective elements 14' shown in FIG. 2. It will be understood that the present invention is not limited to this embodiment, and a reflective mask such as that shown in FIG. 1 may be used as well and to equal effect. The difference is that the mask 10' in FIG. 2 forms a pattern of bright spots or pupil images 50, while the mask 10 shown in FIG. 1 forms a pattern of dark spots or pupil images 50 corresponding to the light-absorbing or non-reflecting areas 16.

Figure 3:
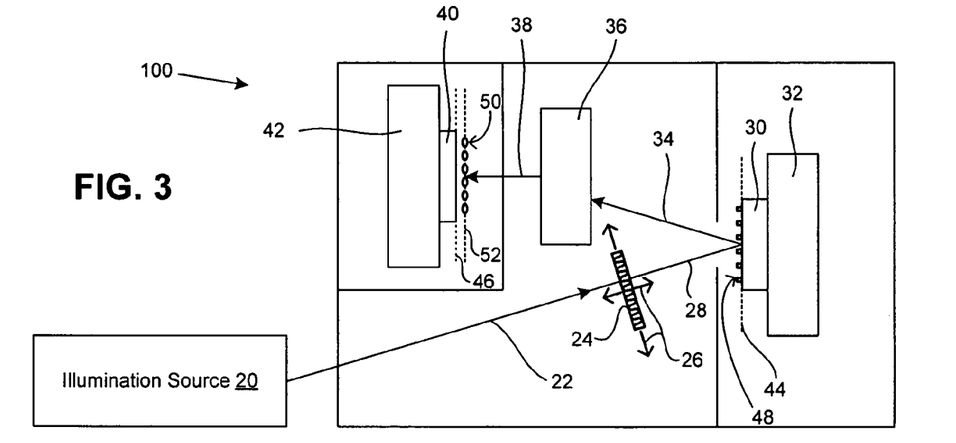
FIGS. 3–6 are schematic diagrams depicting the photolithographic reflective lens systems of several embodiments of a device for determining reflection lens pupil transmission distribution in accordance with the present invention.
Figure 6:
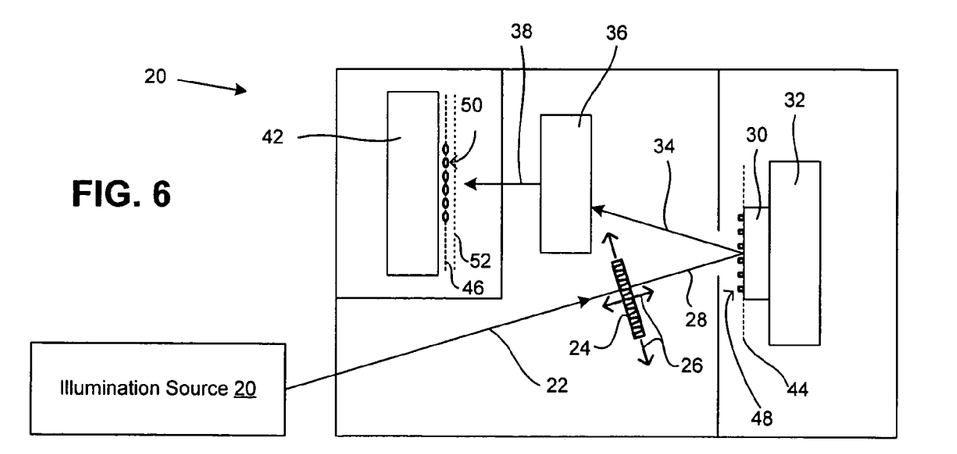

Referring now to FIG. 3, in this embodiment, in the pattern 48 the plurality of light-reflecting areas 14' is depicted as being at the object plane 44. Thus, since the object plane 44 is the focal plane at which the incoming diffused light 28 would be focused, the patterned light 34 reflected from the plurality of light-reflecting areas 14' is correctly focused. As the patterned light 34 proceeds through the lens system 36 and toward the mask 40, the pattern remains focused. In order to obtain a defocused pattern of pupil images 50, the intensity and distribution of the exposure pattern 38 can be measured at a pupil plane 52 which is slightly above or in front of the image plane 46, at which the exposure pattern 38 would be focused normally. As will be understood, in another embodiment, the intensity and distribution of the exposure pattern 38 can be measured at a pupil plane 52 which is slightly behind the image plane 46, at which the exposure pattern 38 would be focused normally. This is the embodiment shown in FIG. 6, in which the pupil images 50 are measured at the pupil plane 52, which is further away from the source and behind the image plane 46. In FIG. 6, for simplicity the wafer 40 is not shown.

Figure 4:
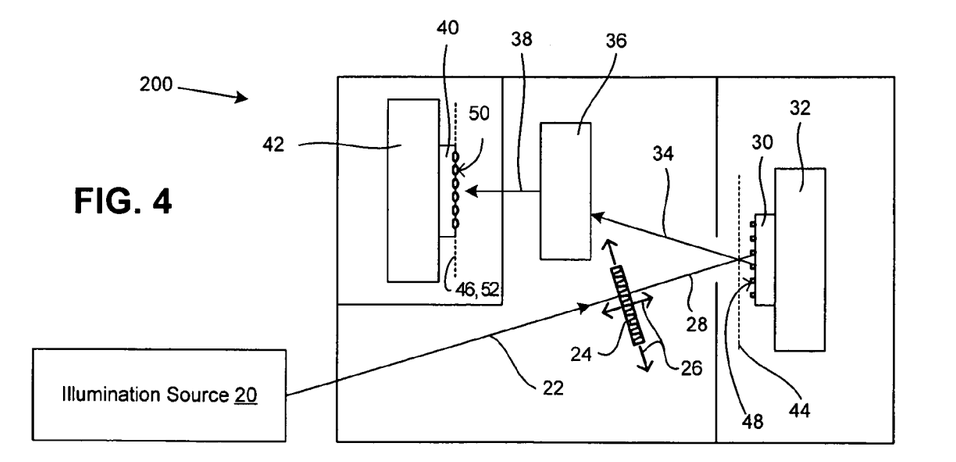

Referring now to FIG. 4, in this embodiment, in the pattern 48 the plurality of light-reflecting areas 14' is slightly behind the object plane 44. Thus, since the object plane 44 is the focal plane at which the incoming diffused light 28 would be focused, the light reflected from the plurality of light-reflecting areas 14' is defocused. As the patterned light 34 proceeds through the lens system 36 and toward the mask 40, the pattern remains slightly defocused. In order to obtain a defocused pupil image 50, the intensity and distribution of the exposure pattern 38 can be measured at a pupil plane 52 which is substantially at or coincident with the image plane 46, at which the exposure pattern 38 would be focused if the light-reflecting pattern 48 was at the object plane 44.

Figure 5:
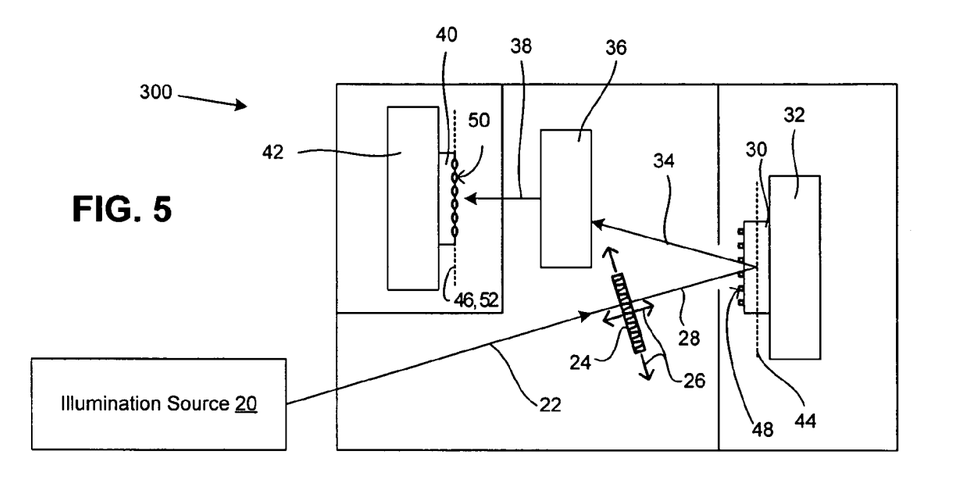

Referring now to FIG. 5, in this embodiment, in the pattern 48 the plurality of light-reflecting areas 14' is slightly in front of the object plane 44. Thus, since the object plane 44 is the focal plane at which the incoming diffused light 28 would be focused, the light reflected from the plurality of light-reflecting areas is defocused. As the patterned light 34 proceeds through the lens system 36 and toward the mask 40, the exposure pattern 38 remains slightly defocused. In order to obtain a defocused pupil image 50, the intensity and distribution of the exposure pattern 38 can be measured at a pupil plane 52 which is substantially at or coincident with the image plane 46, at which the exposure pattern 38 would be focused if the light-reflecting pattern 48 was at the object plane 44.

Referring now to FIG. 6, the arrangement of the device 400 is substantially the same as the arrangement of the device 100 described above with respect to FIG. 3, except that the pattern of pupil images 50 is measured at a pupil plane 52 which is behind the image plane 46, as disclosed above in the disclosure of FIG. 3.

In one embodiment, the pattern 48 includes light-reflecting areas 14' with a substantially same predetermined size and shape. In one embodiment, the light-reflecting areas 14' are spaced apart from one another so that overlap between the pupil images at the image plane is avoided while measuring intensity and/or uniformity of the reflection lens pupil images is enabled. In another embodiment, the pattern 48 includes non-reflecting areas 14 with a substantially same predetermined size and shape. In one embodiment, the non-reflecting areas 14 are spaced apart from one another so that overlap between the pupil images at the image plane is avoided while measuring intensity distribution and/or uniformity of the reflection lens pupil images is enabled.

In one embodiment, the mask or reticle 30 has no substantial effect on the radiation striking the light-reflecting areas of the mask, acting substantially only as a structural support member. In one embodiment, the reticle 30 acts solely as a structural support member. In one embodiment, the reticle is substantially transparent to the light not reflected by the light-reflecting areas 14 or 14' and passing through it, and in another embodiment, the reticle absorbs light not reflected by the light-reflecting areas 14 or 14'. In either case, light falling on non-reflecting areas of the reticle 30 is not reflected.

The diffuser 24, in various embodiments of the present invention, may comprise any of a variety of different devices for diffusing and/or homogenizing light impinging thereon. The diffuser 24, in one embodiment, comprises a material such as a glass, silicon dioxide, calcium fluoride, magnesium fluoride or other materials known for transmitting light. As will be understood, as the wavelengths of the light 22 produced by the illumination source 20 become shorter, use of materials which transmit short wavelength radiation, such as the aforementioned calcium or magnesium fluoride, need to be used. The exact material may be suitably selected by those of ordinary skill in the art based on wavelength, etc. The diffuser 24 includes elements or structures which diffuse or homogenize the light passing through it. In one embodiment, the diffuser homogenizes one or more of spatial intensity distribution, phase, coherence and propagation direction of light or radiation passing therethrough. The diffuser 24 may include structure such as internal crystal deformations, a roughened or frosted outer surface, or other known features which diffuse and/or homogenize the light or radiation passing therethrough.

In other embodiments, the diffuser may have other structures, such as a reflective random mesh through which light is passed; reflective rods (multiple internal reflections also redistribute the light); and a random-phase plate.

In general, the main physical approaches to diffusion for this purpose are scattering (rough surfaces, bulk material non-homogeneity) which can be used with reflective or transmissive optics, multiple internal reflections (in devices such as quartz rods), useful with transmissive optics, and oscillating reflective and transmissive elements (which homogenize the light by averaging), which can be used with reflective or transmissive optics. As noted, for EUV, the optics are generally reflective, although in one embodiment the transmissive diffuser as shown in FIGS. 3–6 may be used. The diffuser should have high efficiency in scattering the light forward (i.e., in the direction of transmission and not backscattering), and should have a good transmission (i.e., low in absorption). Increasing transmission provides more light at the image plane, thus avoiding extended exposure times and obtaining a good signal-to-noise ratio. The diffuser should destroy (or scramble) as much spatial structure (intensity and phase) of the light within the illumination pupil as possible. Suitable diffusive optics can be selected as appropriate to the wavelength and optics with which the diffuser is to be used.

In accordance with a method described in more detail below, by use of the devices 100–400 depicted in FIGS. 3–6, the intensity distribution and uniformity of light forming the pupil images 50 may be measured both with and without the diffuser 24 in place. The data obtained from such measurements may be used to determine both the illumination source aperture uniformity and the reflection lens pupil transmission distribution, and allows for separation of the illumination source aperture uniformity when the reflection lens pupil transmission distribution is being determined.

As noted above, in each embodiment depicted in FIGS. 3–6, the diffuser 24 is disposed between the illumination source 20 and the mask or reticle 30 on which the light-reflecting areas 14, 14' are formed, the diffuser 24 being a transmissive diffuser in these embodiments. This feature, including oscillation of the diffuser as needed, allows use of the diffuser 24 to remove effects from the illumination source aperture uniformity or non-uniformity from the determination of the reflection lens pupil transmission distribution. Use of the apparatus 100, 200, 300 or 400, as well as the various equivalent embodiments disclosed herein, without the diffuser 24 present, allows determination of the pupil distribution with effects from both the illumination source aperture and the reflection lens. Thus, the present invention provides a device and method for separating the effects of these variables affecting the pupil image, and thereby provides for control and adjustment of the photolithographic process to a degree greater than in the prior art.

Figure 7:
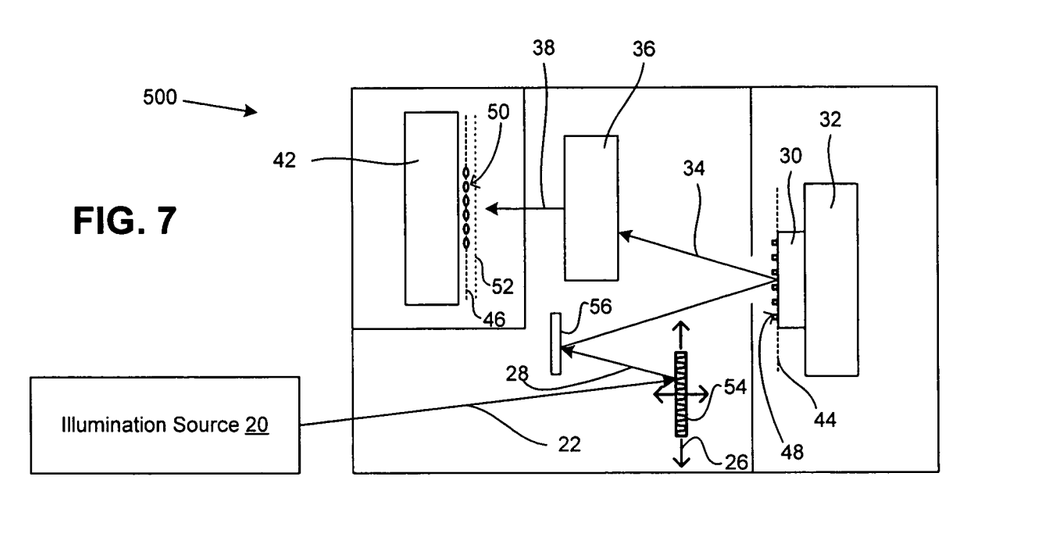
FIG. 7 is a schematic diagram depicting the photolithographic reflective lens systems of an embodiment of a device similar to that shown in FIG. 6, but including a reflecting diffuser.

Referring now to FIG. 7, another exemplary embodiment of the invention is disclosed in the following. FIG. 7 is a schematic diagram depicting the photolithographic reflective lens systems of an embodiment of a device 500 similar to that shown in FIG. 6, but including a reflecting diffuser 54. The reflecting diffuser 54 works in a manner similar to the diffuser 24 in the embodiments depicted in FIGS. 3–6, but light 22 incident on the reflecting diffuser 54 is diffused and reflected, rather than being diffused and transmitted, as in the other embodiments. The diffused light 28 reflected from the reflecting diffuser 54 is then directed to the mask or reticle 30, in the embodiment shown in FIG. 7, by a reflector 56. The reflector 56 may be configured as needed to direct and/or focus the reflected light 28 to the mask 30.

As described with respect to the embodiments shown in FIGS. 3 and 6, in the embodiment of FIG. 7, in the pattern 48 the plurality of light-reflecting areas 14' is depicted as being at the object plane 44. Thus, since the object plane 44 is the focal plane at which the incoming diffused light 28 would be focused, the patterned light 34 reflected from the plurality of light-reflecting areas 14' is correctly focused. As the patterned light 34 proceeds through the lens system 36 and toward the mask 40, the pattern remains focused. In order to obtain a defocused pupil image 50, the intensity and distribution of the exposure pattern 38 can be measured at a pupil plane 52 which is either slightly above or in front of the image plane 46, or slightly behind the image plane 46 at which the exposure pattern 38 would be focused normally. The embodiment actually depicted in FIG. 7 is similar to that of FIG. 6, in which the pupil images 50 are measured at the pupil plane 52, which is further away from the source and behind the image plane 46. As will be understood, in another embodiment (not shown with respect to FIG. 7, but corresponding to the embodiment shown in FIG. 3), the intensity and distribution of the exposure pattern 38 can be measured at a pupil plane 52 which is slightly in front of the image plane 46, at which the exposure pattern 38 would be focused normally. In FIG. 7, as in FIG. 6, for simplicity the wafer 40 is not shown.

As will also be recognized, embodiments (not shown) with a reflective diffuser 54 can be made and used which correspond to the embodiments of FIGS. 4 and 5, in which the light-reflecting areas 14' are either in front of or behind the object plane 44, in which cases the pupil images 50 could be obtained substantially at or coincident with the pupil image plane 52 which would be substantially the same plane as the image plane 46.

As noted above, in the embodiment depicted in FIG. 7, the diffuser 54 is disposed between the illumination source 20 and the mask or reticle 30 on which the light-reflecting areas 14, 14' are formed, but the light 22 is reflected from the diffuser 54 rather than being transmitted, as through the diffuser 24 in the embodiments of FIGS. 3–6. Although it is reflective rather than transmissive, this feature, including oscillation of the diffuser 54 as needed, allows use of the diffuser 54 to remove effects from the illumination source aperture uniformity or non-uniformity from the determination of the reflection lens pupil transmission distribution. Use of the apparatus 100, 200, 300 or 400, as well as the various equivalent embodiments disclosed herein, without the diffuser 24 present, allows determination of the pupil distribution with effects from both the illumination source aperture and the reflection lens. Thus, the present invention provides a device and method for separating the effects of these variables affecting the pupil image, and thereby provides for control and adjustment of the photolithographic process to a degree greater than in the prior art.

In carrying out the method of the present invention with the embodiment of FIG. 7, in one embodiment, when the diffuser 54 is removed, it may be replaced by a reflective non-diffusive element or, in another embodiment, when the diffuser 54 is removed, the illumination source 20 may be realigned to that the light 22 is directed to the mask 30 without reflection.

In one embodiment, the present invention relates to a method for determining reflection lens pupil transmission distribution in a photolithographic imaging system. The method generally includes a step of providing a photolithographic imaging system, such as that described above. In one embodiment, the system includes a device including an illumination source; a reticle supporting a reflective mask layer having a plurality of light-reflecting areas and non-reflecting areas thereon; and a lens system including one or more reflective elements. The method generally further includes a step of measuring first pupil intensity distribution of images formed by light reflected by the light-reflecting areas while passing light from the illumination source to the reflective mask layer and through the lens system. The method further generally includes a step of mounting a diffuser on the illumination source side of the reflective mask layer. The diffuser is substantially as described above, and may be mounted at any of the described locations or equivalents thereof, with the proviso that the diffuser be mounted between the illumination source and the reflective mask layer. When the diffuser has been mounted, the method further generally includes a step of measuring second pupil intensity distribution of pupil images formed by light reflected by the light-reflecting areas while passing light from the illumination source to the diffuser, to the reflective mask layer and through the lens system. When the intensity measurements have been obtained, the method thereafter includes a step of comparing the first and the second pupil intensity distributions to determine reflection lens pupil transmission distribution.

In one embodiment, as described above, the diffuser eliminates or substantially alters contributions of the illumination source aperture uniformity from the pupil images.

In one embodiment, the light-reflective areas, or the non-reflecting areas, in the light-reflecting mask layer have a substantially same predetermined size and shape and are spaced apart from one another so that overlap between the pupil images at the image plane is avoided while measuring intensity and/or uniformity of the reflection lens pupil images is enabled. This arrangement has been illustrated in FIGS. 3–7.

In one embodiment, use of the diffuser decouples contributions to the pupil image arising from the illumination source aperture uniformity from contributions arising from the light-reflecting mask and the reflection lens system.

When the radiation intensity distributions of the pupil images have been obtained with and without the diffuser present, the radiation intensity data can be used to determine illumination source aperture uniformity and reflection lens pupil transmission distribution. As will be understood, the pupil images 50 are formed on the pupil plane 52, and are present as two dimensional images. As such, the intensity distribution of the radiation forming the pupil images can be plotted against (x,y) coordinates, and the radiation intensity at any point (x,y) may be expressed as $P_{(x,y)}$. The radiation intensity distributions may then be referred to as $P_{(x,y)diffuser}$ and $P_{(x,y)nodiffuser}$. In accordance with one embodiment of the method of the present invention, the "first pupil intensity distribution", obtained without the diffuser, is defined as $P_{(x,y) \text{ no diffuser}}$, and the "second pupil intensity distribution", obtained with the diffuser mounted in place, is defined as $P_{(x,y) \text{ diffuser}}$. As set forth in the above discussion, the intensity distribution with the diffuser in place, $P_{(x,y)diffuser}$, approximates the radiation intensity distribution of the reflection lens, i.e., the reflection lens transmission distribution. The diffuser removes non-uniformity effects arising in the illumination source, for example, from the illumination source aperture. The radiation intensity may range from 0 to 1, with 0 representing no radiation, i.e., no transmission, and 1 representing 100% transmission. Thus, the following relationship is defined:

$$P_{(x,y)diffuser} \cong P_{(x,y)reflection\ lens} \quad (1)$$

Furthermore, the following relationship is defined between the measured intensity distributions and the intensity distribution of the illumination source:

$$P_{(x,y)diffuser}/P_{(x,y)no\ diffuser} \cong P_{(x,y)illumination\ source} \quad (2)$$

As indicated in (2), the intensity differences with and without the diffuser in place can be used to approximate the intensity of the illumination source alone. Thus, in accordance with one embodiment of the present invention, use of the diffuser as defined herein allows one to obtain information relating to radiation intensity distributions from each of the illumination source and the lens system separately and together.

The pupil intensities can be measured by various light intensity distribution measurement devices known in the art. For example, in one embodiment, the measurement may be by exposing a photographic plate or material. In another embodiment, the measurement may be by an optical detector such as a CCD, CMOS-pixel sensor or other electronic detector. Thus, in one embodiment, the light intensity distribution measurement device has, e.g., a solid-state image sensing element on which many pixels are two-dimensionally arrayed. Other suitable devices and methods for obtaining the intensity distributions of the pupil images include use of photoresist or other photo-chemical materials. In any case, the response of the radiation-sensing material or device should be related to or proportional to the radiation intensity at the (x,y) location at which the measurement is taken.

As described, the diffuser decouples contributions to the pupil image arising from the illumination source aperture uniformity from contributions arising from the lens system. This allows determination of pupil intensity distributions with and without the diffuser, which corresponds to the lens system pupil transmission distribution and the illumination source aperture uniformity, respectively, to be determined. From these foregoing measurements and with use of the equations, detailed information can be obtained relating to the relative contributions to pupil image uniformity in a photolithographic imaging system, in accordance with the present invention.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, additional arrangements of the reticle, the diffuser and the aperture layer are possible. The present invention relates to device elements and a method of using those elements that may be used in conjunction with virtually any conventional or non-conventional photo lithographic lens system which uses a reflective mask layer. Although the invention has been described with specific reference to EUV light, it is not limited thereto.

INDUSTRIAL APPLICABILITY

The present invention relates to photolithographic lens systems and, more specifically, to a method and apparatus for determining reflection lens transmission distribution while separating contributions of the illumination source aperture uniformity from the lens system pupil transmission distribution. The invention provides a system that can efficiently obtain quantitative measurements of the illumination pattern at the wafer plane of the photolithographic lens system, while separating contributions to non-uniformity originating in the illumination source from contributions to non-uniformity originating in the lens system.

The invention claimed is:

1. A device for determining reflection lens pupil transmission distribution in a photolithographic reflective imaging system, the device comprising:
    an illumination source;
    a reticle supporting a reflective mask layer having a plurality of light-reflecting areas and non-reflecting areas thereon;
    a diffuser removably mounted with respect to the reflective mask layer;
    a lens system comprising one or more reflective elements; and
    an image plane,
    wherein a pupil image corresponding to one or more the plurality of light-reflecting areas in the reflective mask layer is formed at or near the image plane when light from the illumination source passes through the diffuser to the reflective mask layer, reflects from the light-reflecting areas and passes through the lens system, the pupil image having a reflection lens pupil transmission distribution,
    wherein the diffuser is removably mounted for normal operation with the diffuser in place and the diffuser is removed for determination of reflection lens pupil transmission distribution.

2. A device as in claim 1, wherein the diffuser eliminates or substantially alters contributions of the illumination source aperture uniformity from the reflection lens pupil transmission distribution.

3. A device as in claim 1, wherein the light-reflecting areas or the non-reflecting areas in the reflective mask layer have a substantially same predetermined size and shape and are spaced apart from one another so that overlap between the pupil images at the image plane is avoided while measuring intensity and/or uniformity of the pupil images is enabled.

4. A device as in claim 1, wherein the diffuser at least partially homogenizes or randomizes one or more of intensity, spatial intensity distribution, phase, coherence and propagation direction of light passing therethrough.

5. A device as in claim 1, wherein the diffuser is a random phase plate.

6. A device as in claim 1, wherein the diffuser is configured to be oscillated during operation of the device.

7. A device as in claim 1, wherein the reflective mask layer is formed on a surface of the reticle.

8. A device as in claim 1, wherein when the diffuser is removed for operation in determining reflection lens pupil transmission distribution a light-detection apparatus for precisely measuring the intensity distribution and/or uniformity of the pupil image is at or near the pupil plane.

9. A device as in claim 1, wherein the image plane is substantially coplanar with a focal plane of light from the lens system and the reflective mask layer is offset from a focal plane of light from the illumination source.

10. A device as in claim 1, wherein the image plane is offset from a focal plane of light from the lens system and the reflective mask layer is substantially coplanar with a focal plane of light from the illumination source.

11. A method for determining reflection lens pupil transmission distribution and illumination source aperture uniformity in a photolithographic imaging system, comprising:
    providing a photolithographic imaging system comprising:
        an illumination source,
        a reticle supporting a reflective mask layer having a plurality of light-reflecting areas and non-reflecting areas thereon;
        a diffuser removably mounted with respect to the reflective mask layer; and
    a lens system comprising one or more reflective elements;
    removing the diffuser;
    with the diffuser removed, measuring first pupil intensity distribution of one or more first pupil image at an image plane, the one or more first pupil image formed by light reflected by corresponding ones of the plurality of light-reflecting areas while passing light from the illumination source to the reflective mask layer and through the lens system;
    re-mounting the diffuser with respect to the reflective mask layer;
    with the diffuser mounted, measuring second pupil intensity distribution of one or more second pupil image at the image plane, the one or more second pupil image formed by light reflected by corresponding ones of the plurality of light-reflecting areas while passing light from the illumination source, to the diffuser, to the reflective mask layer and through the lens system; and
    comparing the first and the second pupil intensity distributions to determine intensity distribution of radiation emanating from the illumination source and the lens system.

12. A method as in claim 11, wherein the diffuser eliminates or substantially alters contributions of the illumination source aperture uniformity from the reflection lens pupil transmission distribution.

13. A method as in claim 11, wherein the light-reflecting areas or the non-reflecting areas in the reflective mask layer have a substantially same predetermined size and shape and are spaced apart from one another so that overlap between the respective first or second pupil images at the image plane is avoided while measuring intensity and/or uniformity of the first and second pupil images is enabled.

14. A method as in claim 11, wherein use of the diffuser decouples contributions to the second pupil image arising from the illumination source aperture uniformity from contributions arising from the lens system.

15. A method as in claim 11, wherein the first pupil intensity distribution substantially corresponds to combined effects of illumination source intensity distribution and lens system pupil transmission distribution.

16. A method as in claim 11, wherein the second pupil intensity distribution substantially corresponds to lens system pupil distribution.

17. A method as in claim 11, further comprising oscillating the diffuser during the step of measuring second pupil intensity distribution.

18. A device for determining both illumination source aperture uniformity and reflection lens pupil transmission distribution in a photolithographic reflective imaging system, the device comprising:
- an illumination source;
- a reticle supporting a reflective mask layer having a plurality of light-reflecting areas and non-reflecting areas thereon;
- a diffuser removably mounted with respect to the reflective mask layer;
- a lens system comprising one or more reflective elements; and
- an image plane,
- wherein a first pupil image corresponding to one or more of the plurality of light-reflective areas in the reflective mask layer is formed at or near the image plane when the diffuser is removed and light from the illumination source reflects from the light-reflecting areas and passes through the lens system, the first pupil image having a first pupil intensity distribution $P_{(x,y)no\ diffuser}$; and
- wherein a second pupil image corresponding to one or more of the plurality of light-reflective areas in the reflective mask layer is formed at or near the image plane when the diffuser is mounted and light from the illumination source passes through the diffuser, reflects from the light-reflecting areas and passes through the lens system, the second pupil image having a second pupil intensity distribution $P_{(x,y)diffuser}$, and
- wherein the following relationships are defined:

$$P_{(x,y)diffuser} \cong P_{(x,y)reflective\ lens} \quad (1)$$

and $$P_{(x,y)diffuser}/P_{(x,y)no\ diffuser} \cong P_{(x,y)illumination\ source} \quad (2).$$

19. A device as in claim 18, wherein the diffuser at least partially homogenizes one or more of spatial intensity distribution, phase, coherence and propagation direction of light passing therethrough.

20. A device as in claim 18, wherein the diffuser at least partially homogenizes or randomizes one or more of intensity, spatial intensity distribution, phase, coherence and propagation direction of light passing therethrough.

* * * * *